United States Patent [19]

Higashiyama

[11] Patent Number: 5,089,310
[45] Date of Patent: Feb. 18, 1992

[54] IMAGE TRANSFERRING SHEET AND A METHOD FOR FABRICATING THE SAME

[75] Inventor: Shunichi Higashiyama, Yokkaichi, Japan

[73] Assignee: Brother Kogyo Kabushiki Kaisha, Japan

[21] Appl. No.: 547,178

[22] Filed: Jul. 3, 1990

[30] Foreign Application Priority Data

Jul. 25, 1989 [JP] Japan .................. 1-192212

[51] Int. Cl.$^5$ ............................................. B32B 3/00
[52] U.S. Cl. ...................................... 428/40; 428/42; 428/195; 428/204; 428/206; 428/192; 428/411.1; 428/913; 156/233
[58] Field of Search ............... 428/40, 42, 195, 204, 428/206, 192, 411.1, 913; 156/233

[56] References Cited

U.S. PATENT DOCUMENTS

| | | | |
|---|---|---|---|
| 4,510,206 | 4/1985 | Shuman | 428/348 |
| 4,592,946 | 6/1986 | Shuman | 428/200 |
| 4,938,617 | 7/1990 | Mecke et al. | 428/355 |
| 4,971,854 | 11/1990 | Hinishi et al. | 428/409 |

FOREIGN PATENT DOCUMENTS

| | | |
|---|---|---|
| 61-173981 | 8/1986 | Japan . |
| 1-206092 | 8/1989 | Japan . |
| 2-2166 | 1/1990 | Japan . |
| 2-3390 | 1/1990 | Japan . |
| 2-10062 | 1/1990 | Japan . |
| 2-10063 | 1/1990 | Japan . |
| 0297947 | 4/1990 | Japan . |

*Primary Examiner*—Patrick J. Ryan
*Attorney, Agent, or Firm*—Oliff & Berridge

[57] ABSTRACT

An image transferring sheet is made of a combination of a thermally bonding sheet and a developer sheet and a method for fabricating such a sheet is provided. In the image transferring sheet, both sheets are hot-pressed in such a state that a thermoplastic resin layer of the thermally bonding sheet and a developer layer of the developer sheet on which an image has been formed are superposed, and the developer sheet should have a size larger than the thermally bonding sheet. The use of the image transferring sheet ensures easy separation of one sheet from another and transfer of the developer layer of the developer sheet onto the thermally bonding sheet.

19 Claims, 3 Drawing Sheets

IMAGE TRANSFERRING SHEET AND A METHOD FOR FABRICATING THE SAME

BACKGROUND OF THE INVENTION

1. Field of the Invention

This invention relates to an image transferring sheet which is a combination of a thermally bonding sheet and a developer sheet superposed with each other and wherein the developer sheet is readily released from the thermally bonding sheet while transferring a developer layer of the developer sheet to the thermally bonding sheet. The invention also relates to a fabrication method thereof.

2. Description of Related Art

Color image formation apparatus of the type making use of a photo-sensitive and pressure-sensitive medium which has in the surface layer microcapsules containing a dye precursor, a photocurable resin and a photopolymerization initiator, and a developer medium having in the surface layer a material, or a so-called developer, capable of reaction with the dye precursor in the microcapsules for color development are known. In this apparatus, light is irradiated on the photo-sensitive and pressure-sensitive medium according to imagewise information to cure the photocurable resin irradiated with the light. Thereafter, the developer medium is superposed on the photo-sensitive and pressure-sensitive medium and pressed, so that non-cured microcapsules are broken to cause the dye precursor therein and the developer in the developer medium to react thereby forming a color image on the developer-bearing surface. This type of apparatus is known, for example, as shown in Japanese Laid-open Patent Application No. 173981/1986.

According to the apparatus described above, the color image can be formed on the developer medium, but it is not possible to form images on ordinary paper such as post card, cloth, plastic films and the like. In the case where it is positively intended to form images on post card or cloth, an image is formed on the developer medium, after which it may be possible to fix the image on the medium such as post card or cloth by bonding. However, this is not favorable because the medium increases in thickness with an increasing weight.

We developed and proposed in Japanese Laid-open Patent Application No. 206092/1989 a method for forming an image wherein the developer layer-bearing surface of a developer medium on which an image has been formed and the thermoplastic resin-bearing surface of a thermally bonding sheet comprised of a sheet substrate and a thermoplastic resin layer formed on the substrate are superposed and hot-pressed. After cooling, the support of the developer medium is released to transfer the developer layer (image layer) alone of the developer medium to the thermally bonding sheet. Subsequently, the thermally bonding sheet on which the developer layer has been transferred is bonded to an image-forming material such as post card or plastic film, thereby forming the image on the image-forming material.

In this method of the prior application, the thermally bonding sheet is bonded to the surface of the image-forming material along with the developer layer having been transferred, so that the flexibility of the image-forming material is impeded by the influence of the sheet substrate of the thermally bonding sheet. In order to form an image on an image-forming material, such as cloth, whose flexibility should be kept, other methods have been proposed, for example, in Japanese Laid-open Patent Application No. 3390/1990 and Japanese Laid-open Utility Model Nos. 10062/1990 and 10063/1990.

In these methods, while bonding forces among the sheet substrate of the thermally bonding sheet, the thermoplastic resin layer, the developer layer of the developer medium and the image-forming material are taken into account, the sheet substrate of the thermally bonding sheet which has been bonded to the image-forming material along with the developer layer is separated from the image-forming material. It will be noted that the transfer of the developer layer alone to the thermally bonding sheet is made in the same manner as in the foregoing methods.

However, these methods are disadvantageous in that depending on the type of thermoplastic resin used in the thermally bonding sheet, the manner of the hotpressing, the size of the thermally bonding sheet and the size of the developer medium, the transfer of the developer layer alone of the developer medium to the thermally bonding sheet may not proceed satisfactorily.

For instance, as shown in FIG. 6, when a thermally bonding sheet 22 is larger in size than a developer medium 21, an EVA resin having a softening point of 80° C. to 85° C. is formed on a sheet substrate 23 as a thermoplastic resin layer 20 in a thickness of 50 μm and a heat roller having a line pressure of 1 kg/cm at 140° C., the hot-pressed sheets are in such a state as shown in an enlarged section view of FIG. 6. More particularly, the thermoplastic resin 20 is melted down at the side of a support 21a of the developer medium 21, whereon a developer layer 21b is coated, so that the support 21a is unable to separate easily.

SUMMARY OF THE INVENTION

The present invention contemplates solving the above problems and provides an image transferring sheet and a method for transferring a developer layer of a developer medium alone to a thermally bonding sheet by which a wide choice of thermoplastic resin used in the thermally bonding sheet becomes possible and wide hot pressing conditions are covered.

In order to achieve the above object, there is provided, in one aspect of the invention, an image transferring sheet comprising a thermally bonding sheet having a base sheet with a thermoplastic resin layer on one side thereof and a developer medium having a support larger in surface area than a surface area of the thermoplastic resin layer of the base sheet, with a developer layer including an image, the thermally bonding sheet and developer medium being hot-pressed together with the developer layer and the thermoplastic resin layer in face-to-face relation such that the edges of the developer medium extend beyond the thermoplastic resin layer. And further, there is provided a method for transferring an image which comprises the steps of providing a developer medium having a developer layer on a support and a thermally bonding sheet having a thermoplastic resin layer on a sheet substrate, the developer medium having a surface area larger than a surface area of the thermoplastic resin layer of the thermally bonding sheet, hot-pressing the developer medium and thermally bonding sheet so that the developer layer on which an image has been formed and the thermoplastic resin layer are in face-to-face relation and the edges of the developer medium extend beyond the thermoplastic resin layer, and separating the support from the developer layer to transfer the developer layer of the developer medium to the thermally bonding sheet.

According to the sheet and the method of the invention, the thermoplastic resin of the thermally bonding sheet is not melted down toward the side of the support of the developer medium, so that the support can be readily separated, permitting the developer layer alone to be transferred to the thermally bonding sheet. When the thermally bonding sheet is bonded to the image-forming material, the material on which the image has been formed can be given a high commercial value.

Since the hot pressing conditions under which the thermally bonding sheet and the developer medium are bonded can be widened, a wide choice of thermoplastic resin becomes possible.

The above and further objects and novel features of the invention will more fully appear from the following detailed description when the same is read in connection with the accompanying drawings. It is to be understood, however, that the drawings are for purpose of illustration only and do not define the limits of the invention.

DETAILED DESCRIPTION OF THE PREFERRED EMBODIMENTS

Figure 3:
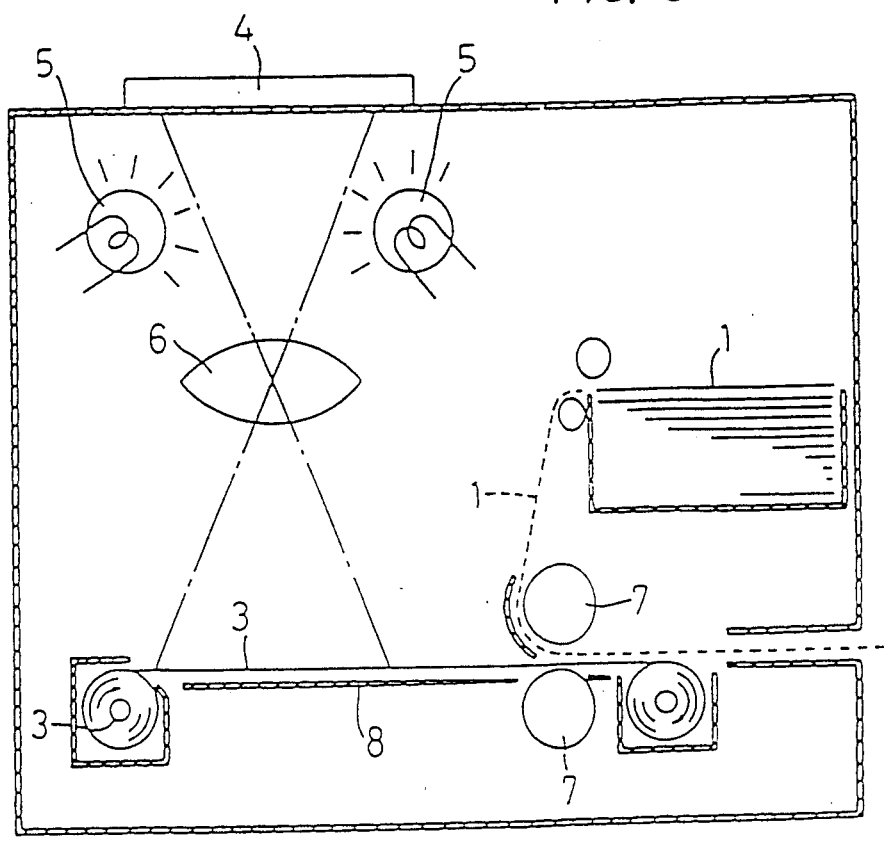
FIG. 3 is a schematic view, partially in section, of an apparatus for forming a color image.

A procedure of forming a visible image on a developer medium is described with reference to the color image-forming apparatus shown in FIG. 3.

Figure 1:
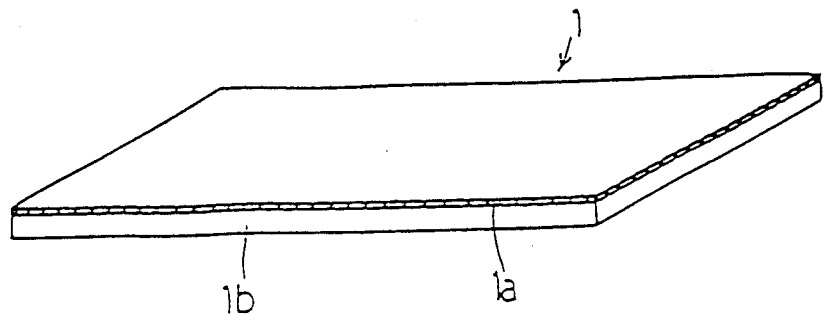
FIG. 1 is a schematic perspective view of a developer sheet according to an embodiment of the invention.

A photo-sensitive and pressure-sensitive medium 3 having a surface layer wherein microcapsules containing a dye precursor and a photosensitive material are contained is provided. Light irradiated from a light source 5 is reflected at an original 4 and the reflected light is focused through a lens 6 on the surface of the medium 3 by exposure on an exposure mount 8. The photo-sensitive and pressure-sensitive medium 3 and a developer medium 1 having a developer layer 1a on a support 1b as shown in FIG. 1 are superposed by the use of a feed system in such a way that the capsule-bearing surface of the medium 3 and the developer layer 1a of the medium 1 are in face-to-face relation. The superposed mediums 1, 3 are passed through and pressed with press rollers 7, thereby forming a visible image on the developer layer 1a of the developer medium.

Figure 2:
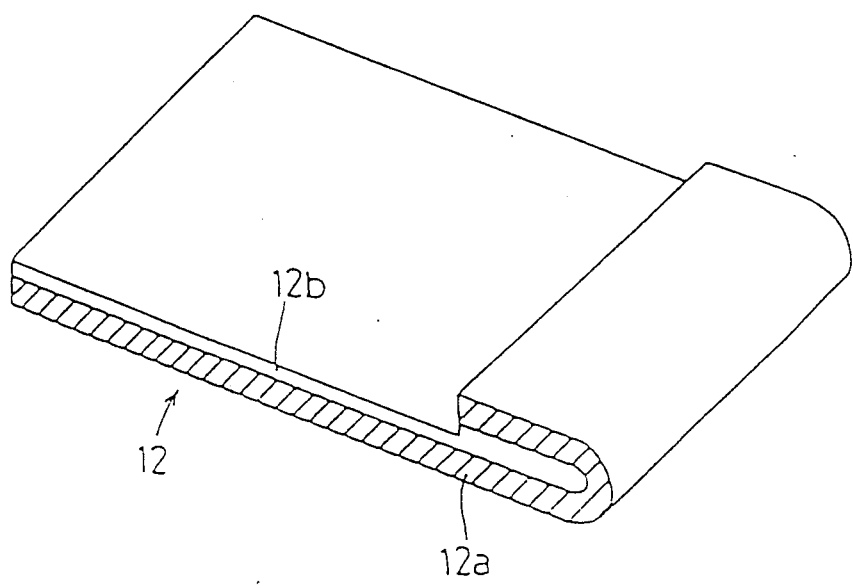
FIG. 2 is a schematic perspective view of a thermally bonding sheet according to an embodiment of the invention.

In this embodiment, the developer medium 1 used has such a structure that the developer layer 1a and the support 1b are separable from each other as in FIG. 1. The support 1b is selected from those materials having relatively good releasing properties such as, for example, glassine paper, polyester film, polyethylene film, polypropylene film and the like. The developer layer 1a is selected from mixtures of phenolic compounds such as p-phenylphenol or aromatic carboxylic acid compounds such as salicyclic acid, gallic acid, propyltannic acid and the like, and thermoplastic binders. As shown in FIG. 2, the thermally bonding sheet 12 has a structure including a transparent thermoplastic resin 12b formed on a sheet substrate 12a. The adhesion force between the sheet substrate 12a and the thermoplastic resin 12b should be controlled at a level higher than the adhesion force between the support 1b and the developer layer 1a of the developer medium.

The sheet substrate 12a of the thermally bonding sheet 12 in this embodiment is not critical with respect to the type and includes plastic films or paper provided that it is not deformed when subjected to hot-pressing rolls. Polyethylene terephthalate film is preferably used.

The thermoplastic resin 12b used may be vinyl resins such as ethylene/vinyl acetate copolymers, resin esters, vinyl alcohol/vinyl acetate copolymers, vinyl alkyl ether/maleic anhydride copolymers, polyvinyl chloride, vinyl chloride/vinyl acetate copolymers and the like, acrylic resins such as polyethyl acrylate, polybutyl methacrylate, polymethyl cyanoacrylate and the like, styrene resins, polyamide resins and waxes.

In this embodiment, the sheet substrate 12a of the thermally bonding sheet 12 used is a polyethylene terephthalate film and the thermoplastic resin 12b is formed by providing a 41% emulsion of a styrene/acryl copolymer, applying the emulsion on the sheet substrate 12a by means of a #12 bar coater (as specified in JIS K5400), followed by drying with hot air in an oven at approximately 120° C. for 60 seconds. The sheet substrate 12a is enfolded at one end thereof as shown in FIG. 2 so that part of the thermoplastic resin layer 12b is put on and adhered to another portion thereof. Accordingly, the end portion does not adhere to the developer layer 1a. This portion is used as a pull by which the support 1b of the developer medium 1 is peeled off by hand.

A procedure of transferring the visible image, which has been formed on the developer medium 1, to the thermally bonding sheet 12 is described with reference to FIGS. 4 and 5.

Figure 4:
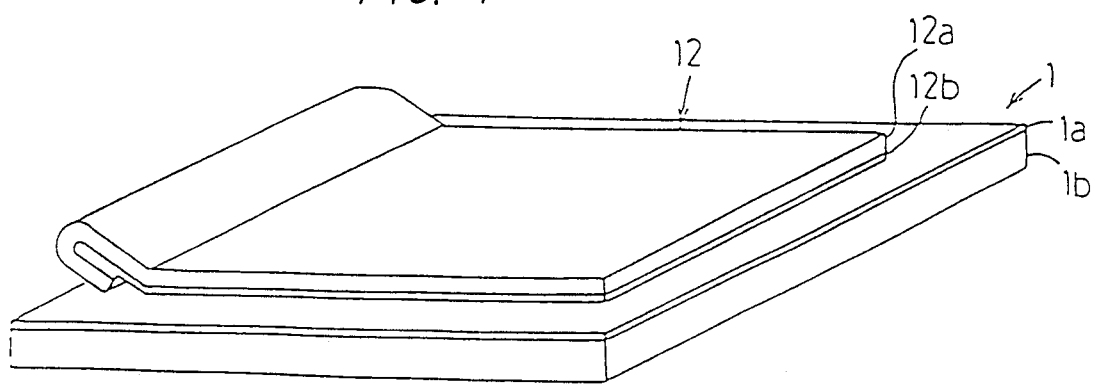
FIG. 4 is a schematic perspective view of a thermally bonding sheet and a developer sheet which are superposed.
Figure 5:
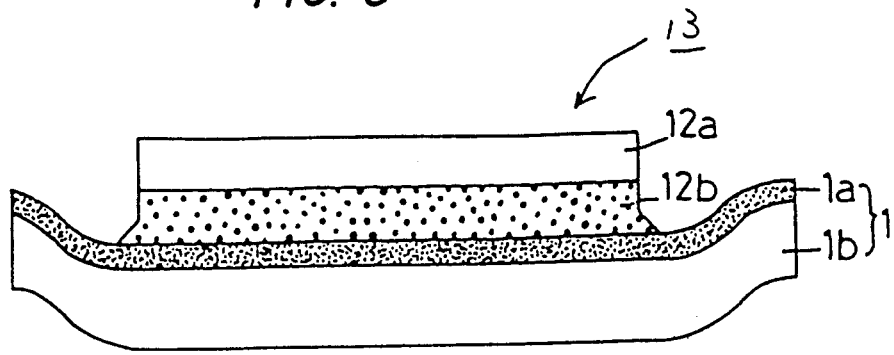
FIG. 5 is an enlarged side view, in section, of an image transferring sheet.
Figure 6:
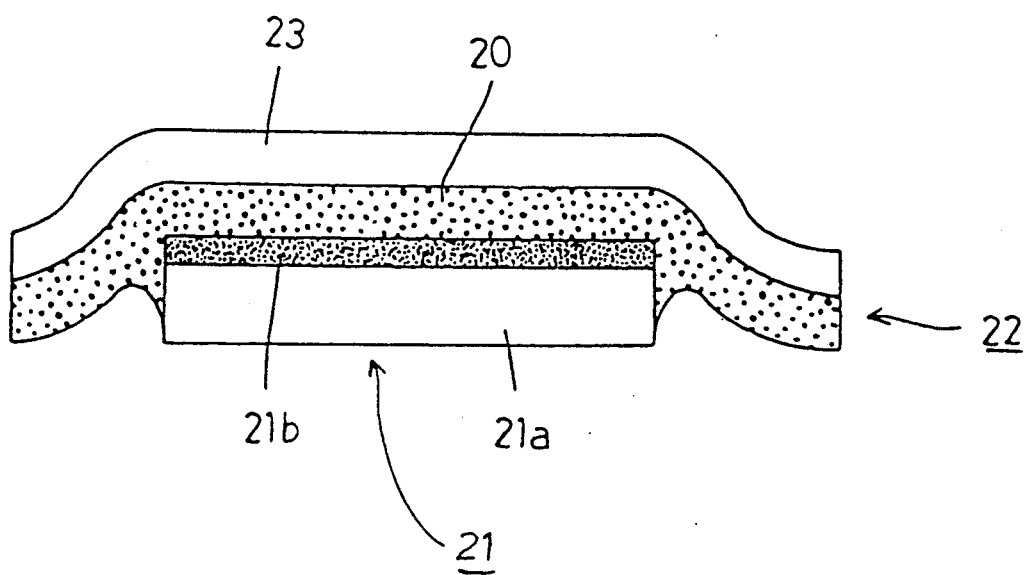
FIG. 6 is an enlarged side view, in section, of a known image transferring sheet.

The surface of the developer layer 1a of the developer medium 1 on which the visible image has been formed and the thermoplastic resin layer 12b of the thermally bonding sheet 12 are superposed so that the thermally bonding sheet 12 is completely covered with the developer medium as shown in FIG. 4. These sheets are passed through and hot-pressed with hot pressing rolls heated at approximately 140° C., thereby causing the developer medium 1 and the thermally bonding sheet 12 to be thermally bonded. The bonded sheets are cooled down to normal temperatures, with the result that a thermally bonding sheet-bearing developer medium 13 is obtained as shown in the enlarged sectional view of FIG. 5.

Next, the support 1b of the developer medium 1 is peeled off. As a result, the developer layer 1a alone is transferred to the thermoplastic resin 12b of the thermally bonding sheet 12.

Thereafter, the developer layer 1a including the image left on the sheet substrate 12a is contacted and hot-pressed to a material such as a cloth or postcard on the surface of which the image is to be formed and cooled down. Further, the sheet substrate 12a is peeled off from the surface of the material. As a result, both the developer layer 1a including the image and the thermoplastic resin layer 12b are left on the surface of the material. In this way, the image is formed on the material.

In this embodiment, the developer medium used includes the support 1b and the developer layer 1a which are separable from each other, and these layers are separated at the interface. In this connection, the image transferring method can be carried out using a developer paper which has been put on the market by the Meed Corporation under the name of Cycolor and which is a developer medium not intended to be separable at the interface. In this case, a peel-off apparatus for image transfer as described in Japanese Laid-open Utility Model No. 2166/1990 is appropriately employed.

The thermally bonding sheet 12 may have a structure wherein the sheet substrate 12a and the thermoplastic resin layer 12b are separable at the interface thereof. In this case, after bonding, to an imageforming material, of the thermally bonding sheet 12 to which the developer layer 1a has been transferred according to the method of the invention, the sheet substrate 12a can be separated. If the image-forming material is cloth, good texture is obtained.

When the thermally bonding sheet is enfolded at a part thereof as in the above embodiment and/or has a portion where any thermoplastic resin is not applied, the developer medium should have a size larger than a size of the thermally bonding sheet at an adhesive surface portion thereof.

While the invention has been particularly shown and described with reference to preferred embodiment thereof, it will be understood by those skilled in the art that the foregoing and other changes in form and details can be made therein without departing from the spirit and scope of the invention.

What is claimed is:

1. An image transferring sheet comprising:
   a thermally bonding sheet having a base sheet with a thermoplastic resin layer;
   a developer medium having a support larger in surface area than a surface area of the thermoplastic resin layer of the base sheet, with a developer layer including an image, the support and the developer layer being made of such materials that the support and the developer layer are separable from each other, an adhesive force between the base sheet and the thermoplastic resin layer being stronger than an adhesive force between the support and the developer layer;
   wherein, the thermally bonding sheet and the developer medium are hot-pressed together with the thermoplastic resin layer and the developer layer in face-to-face relation such that the edges of the developer medium extend beyond the thermoplastic resin layer.

2. An image transferring sheet according to claim 1, wherein the base sheet is selected from the group consisting of polyester films, polyethylene films, and polypropylene films.

3. An image transferring sheet according to claim 1, wherein the thermoplastic resin is selected from the group consisting of vinyl resins, acrylic resins, styrene resins, polyamide resins and waxes.

4. An image transferring sheet according to claim 1, wherein the support is selected from the group consisting of glassine paper, polyester film, polyethylene film and polypropylene film.

5. An image transferring sheet according to claim 1, wherein the developer layer is made of one or more materials selected from the group consisting of phenolic compounds and aromatic carboxylic acid compounds.

6. An image transferring sheet according to claim 1, wherein the base sheet is enfolded at one end thereof so as to form a pull tab for manual separation of the base sheet from the support.

7. A method for fabricating an image transferring sheet comprising the steps of:
   providing a thermally bonding sheet having a thermoplastic resin layer formed on a base sheet;
   providing a developer medium having a developer layer including an image formed on a support, said support being larger in surface area than a surface area of the thermoplastic resin layer of the base sheet; and
   hot-pressing the thermally bonding sheet and the developer medium while the thermoplastic resin layer and the developer layer are in face-to-face relation such that the edges of the developer medium extend beyond the thermoplastic resin layer.

8. A method for forming an image on a material comprising the steps of:
   forming a thermally bonding sheet by coating a thermoplastic resin layer on a base sheet;
   forming an image on a developer layer coated on a support larger in surface area than a surface area of the thermoplastic resin layer of the base sheet;
   hot-pressing the thermally bonding sheet and the base sheet with the thermoplastic resin layer and the developer layer in face-to-face relation such that the edges of the developer medium extend beyond the thermoplastic resin layer;
   peeling the support from the base sheet to leave the developer layer including the image on the base sheet;
   contacting and hot-pressing the developer layer including the image on the material; and
   peeling the base sheet to leave the developer layer including the image on the material.

9. A method according to claim 8, wherein the base sheet is enfolded at one end thereof to form a pull tab which is pulled in said peeling the base sheet.

10. An image transferring sheet kit comprising:
    a thermally bonding sheet having a base sheet with a thermoplastic resin layer; and
    a developer medium having a support with a surface area larger than a surface area of the thermoplastic resin layer of the thermally bonding sheet, and a developer layer formed thereon,
    wherein the thermally bonding sheet and developer medium are adapted to be hot pressed with the thermoplastic resin layer and developer layer in face to face relation such that the edges of the developer medium extend beyond the thermoplastic resin layer, and subsequently separated to transfer an image from the developer medium to the thermally bonding sheet.

11. An image transferring sheet kit according to claim 10, wherein the base sheet is selected from the group consisting of polyester films, polyethylene films, and polypropylene films.

12. An image transferring sheet kit according to claim 10, wherein the thermoplastic resin is selected from the group consisting of vinyl resins, acrylic resins, styrene resins, polyamide resins and waxes.

13. An image transferring sheet kit according to claim 10, wherein the support is selected from the group consisting of glassine paper, polyester film, polyethylene film and polypropylene film.

14. An image transferring sheet kit according to claim 10, wherein the developer layer is made of one or more materials selected from the group consisting of phenolic compounds and aromatic carboxylic acid compounds.

15. An image transferring sheet kit according to claim 10, wherein adhesive force between the base sheet and the thermoplastic resin layer is stronger than adhesive force between the support and the developer layer.

16. An image transferring sheet kit according to claim 10, wherein the base sheet is enfoldable at one end thereof so as to form a pull tab for manual separation of the base sheet from the support.

17. The image transferring sheet according to claim 1, wherein all outer peripheral edges of said developer layer extend beyond all outer peripheral edges of said thermoplastic resin layer so that said thermoplastic resin layer does not contact said support when said thermally bonding sheet and said developer medium are hot-pressed together.

18. The method according to claim 7, wherein all outer peripheral edges of said developer layer extend beyond all outer peripheral edges of said thermoplastic resin layer so that said thermoplastic resin layer does not contact said support when said thermally bonding sheet and said developer medium are hot-pressed together.

19. The image transferring sheet kit according to claim 10, wherein all outer peripheral edges of said developer layer extend beyond all outer peripheral edges of said thermoplastic resin layer so that said thermoplastic resin layer does not contact said support when said thermally bonding sheet and said developer medium are hot-pressed together.

* * * * *